United States Patent [19]

Manabe et al.

[11] 4,114,052
[45] Sep. 12, 1978

[54] PRESETTABLE DYNAMIC DELAY FLIP-FLOP CIRCUIT

[75] Inventors: Kenshi Manabe, Yokohama; Kouichirou Satou, Kawasaki, both of Japan

[73] Assignee: Tokyo Shibaura Electric Co., Ltd., Tokyo, Japan

[21] Appl. No.: 801,254

[22] Filed: May 27, 1977

[30] Foreign Application Priority Data

May 29, 1976 [JP] Japan .................. 51-62769

[51] Int. Cl.$^2$ ............ H03K 3/286; H03K 3/353; H03K 21/30; H03K 23/30
[52] U.S. Cl. .................. 307/279; 307/208; 307/225 C; 307/247 R; 307/251; 307/289
[58] Field of Search .......... 307/220 R, 220 C, 221 R, 307/221 C, 223 R, 223 C, 224 R, 224 C, 225 R, 225 C, 247 R, 208, 289, 291, 279, 251; 328/39, 41, 48, 196, 200, 206

[56] References Cited

U.S. PATENT DOCUMENTS

| 3,626,202 | 12/1971 | Pound | 307/208 |
| 3,823,551 | 7/1974 | Riehl | 307/225 C X |
| 3,829,712 | 8/1974 | Hama | 307/225 C |
| 4,002,926 | 1/1977 | Moyer | 307/225 C |

FOREIGN PATENT DOCUMENTS

| 2,267,666 | 11/1975 | France | 307/221 C |
| 2,309,080 | 9/1973 | Fed. Rep. of Germany | 307/225 C |

Primary Examiner—Larry N. Anagnos
Attorney, Agent, or Firm—Finnegan, Henderson, Farabow & Garrett

[57] ABSTRACT

A presettable dynamic delay flip-flop circuit including two first and second series-connected ½ bit delay circuits, a gate circuit for supplying these delay circuits with a control signal for controlling their operation, and a switching circuit for supplying the second delay circuit with preset data capable of freely presetting the voltage level of an output signal from said flip-flop circuit. The delay circuits and switching circuit are respectively formed of clocked inverters. The flip-flop circuit is formed of a small number of elements and operated at high frequency.

7 Claims, 9 Drawing Figures

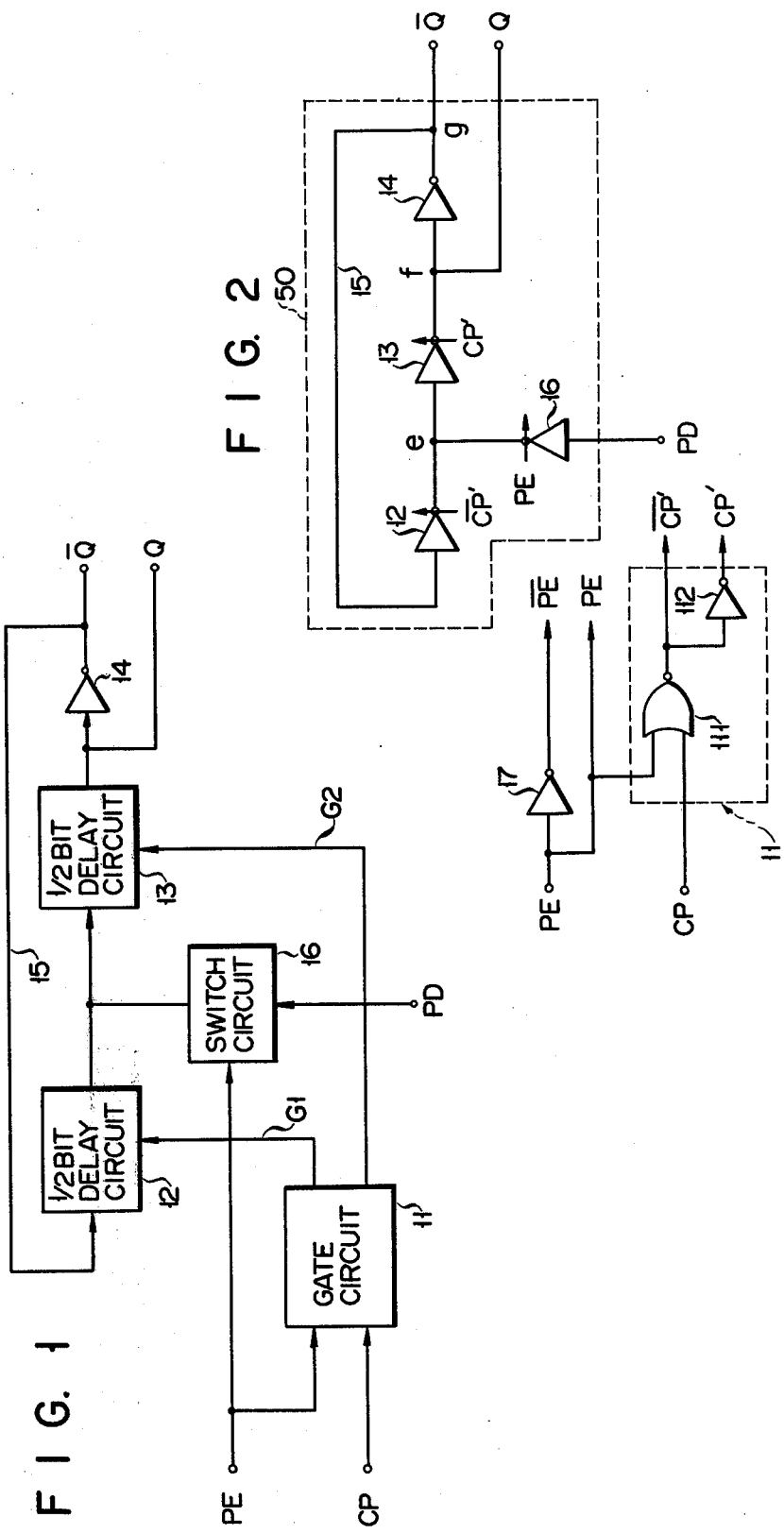

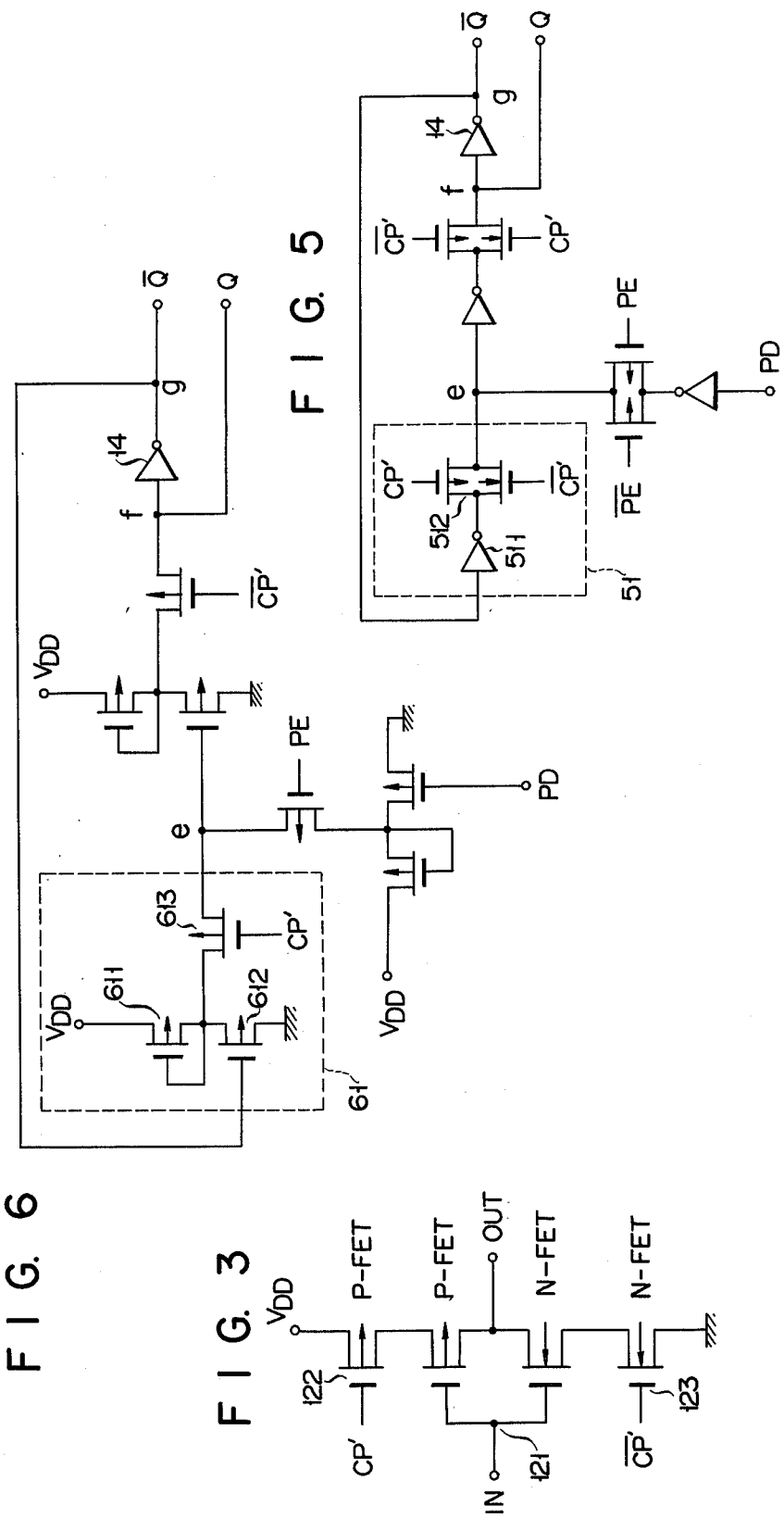

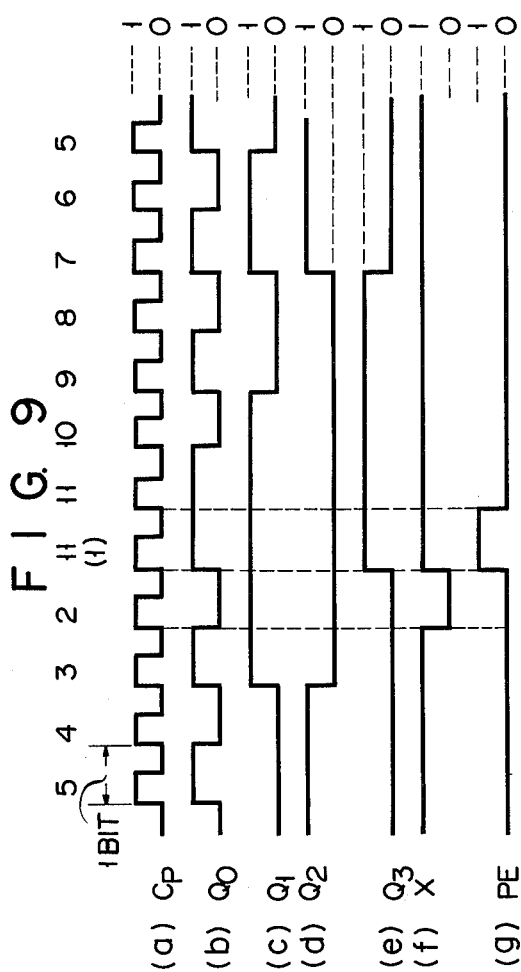
F I G. 8
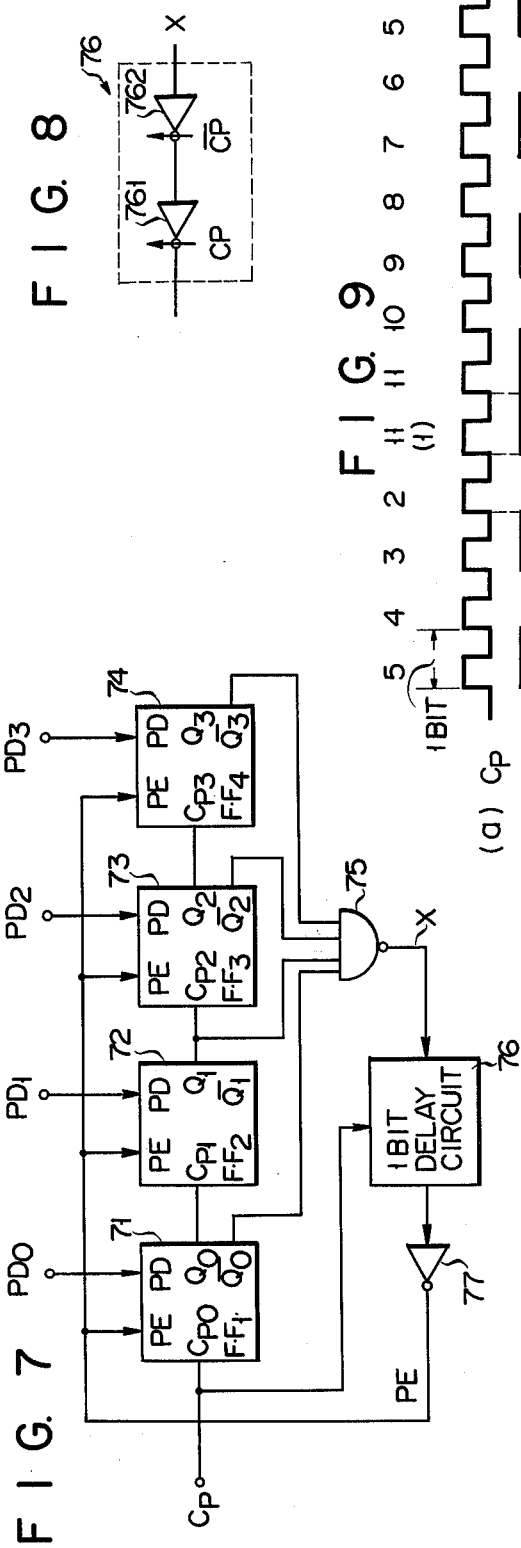
F I G. 7
F I G. 9

PRESETTABLE DYNAMIC DELAY FLIP-FLOP CIRCUIT

BACKGROUND OF THE INVENTION

This invention relates to a presettable dynamic delay flip-flop circuit, and more particularly to a binary counter used with, for example, a ripple carrier type programmable counter capable of freely presetting a count scale number by means of a program input.

A widening range of applying an integrated circuit (abbreviated as "IC") has made it necessary to develop a programmable counter capable of being operated at a higher frequency. An IC device formed of bipolar transistors can indeed meet a demand for a high frequency counter, but has the drawbacks that it consumes a great deal of power, has a low degree of integration, and is found unadapted for large scale integration (abbreviated as LSI). To resolve these problems, an insulated gate field effect transistor (abbreviated as "IGFET") is generally used for the purpose of LSI. However, an LSI device of IGFET's has an inferior frequency characteristic to an LSI device of bipolar transistors.

The prior art programmable counter includes, for example, a synchronization type counter comprising a J-K flip-flop circuit and a ripple carrier type counter including a delay type flip-flop circuit. These known programmable counters must always be provided with a static binary counter including a feedback circuit to prevent the erroneous operation of the counter circuits, and consequently makes it impossible to decrease a number of circuit elements by applying a dynamic binary counter. Further, any of the known programmable counters has a complicated circuit arrangement and an undesirable frequency characteristic.

SUMMARY OF THE INVENTION

It is accordingly an object of this invention to provide a presettable dynamic delay flip-flop circuit (dynamic binary counter) which uses a smaller number of elements and can be operated at a higher frequency than has been possible in the past.

Another object of the invention is to provide a programmable counter having a desirable frequency characteristic and admitting of a higher degree of integration by application of a presettable dynamic delay flip-flop circuit.

According to an aspect of this invention, there is provided a presettable dynamic delay flip-flop circuit which comprises gate means served to stop transfer of a clock pulse at least during the period in which presetting in carried on and permit transfer of a clock pulse on other occasion than during said presetting period; first delay means served to remain intact during the presetting period and carry out ½ bit delay in synchronism with a first gate output from the gate means on other occasions than during the presetting period; second delay means connected to the output terminal of said first delay means and served to feedback a delay output from said first delay means, be rendered conducting during the presetting period, and carry out ½ bit delay in synchronism with a second gate output from the first gate means on other occasions than during the presetting period; and switching means rendered conducting only during the presetting period to supply preset data to said second delay means.

A programmable counter according to one embodimeht of this invention has a ripple carrier type circuit arrangement comprising a plurality of series connected presettable dynamic delay flip-flop circuits, and enables any desired program data to be preset by circuit means for selecting a prescribed output from those issued from said plural flip-flop circuits.

BRIEF DESCRIPTION OF THE DRAWING

FIG. 1 is a block circuit diagram of a presettable dynamic delay flip-flop circuit according to one embodiment of this invention;

FIG. 2 shows a concrete arrangement of the flip-flop circuit of FIG. 1;

FIG. 3 indicates a detailed circuit arrangement of a clocked inverter included in FIG. 2;

FIG. 5 is a modification of the flip-flop circuit of FIG. 2;

FIG. 6 is another modification of the flip-flop circuit of FIG. 2;

FIG. 7 is a circuit diagram of a programmable counter comprising the flip-flop circuit of FIG. 1;

FIG. 8 is a detailed diagram of a 1 bit delay circuit included in FIG. 7; and

FIG. 9 is a time chart illustrating the operation of the programmable counter of FIG. 7.

DETAILED DESCRIPTION OF THE PREFERRED EMBODIMENTS

Figure 4:
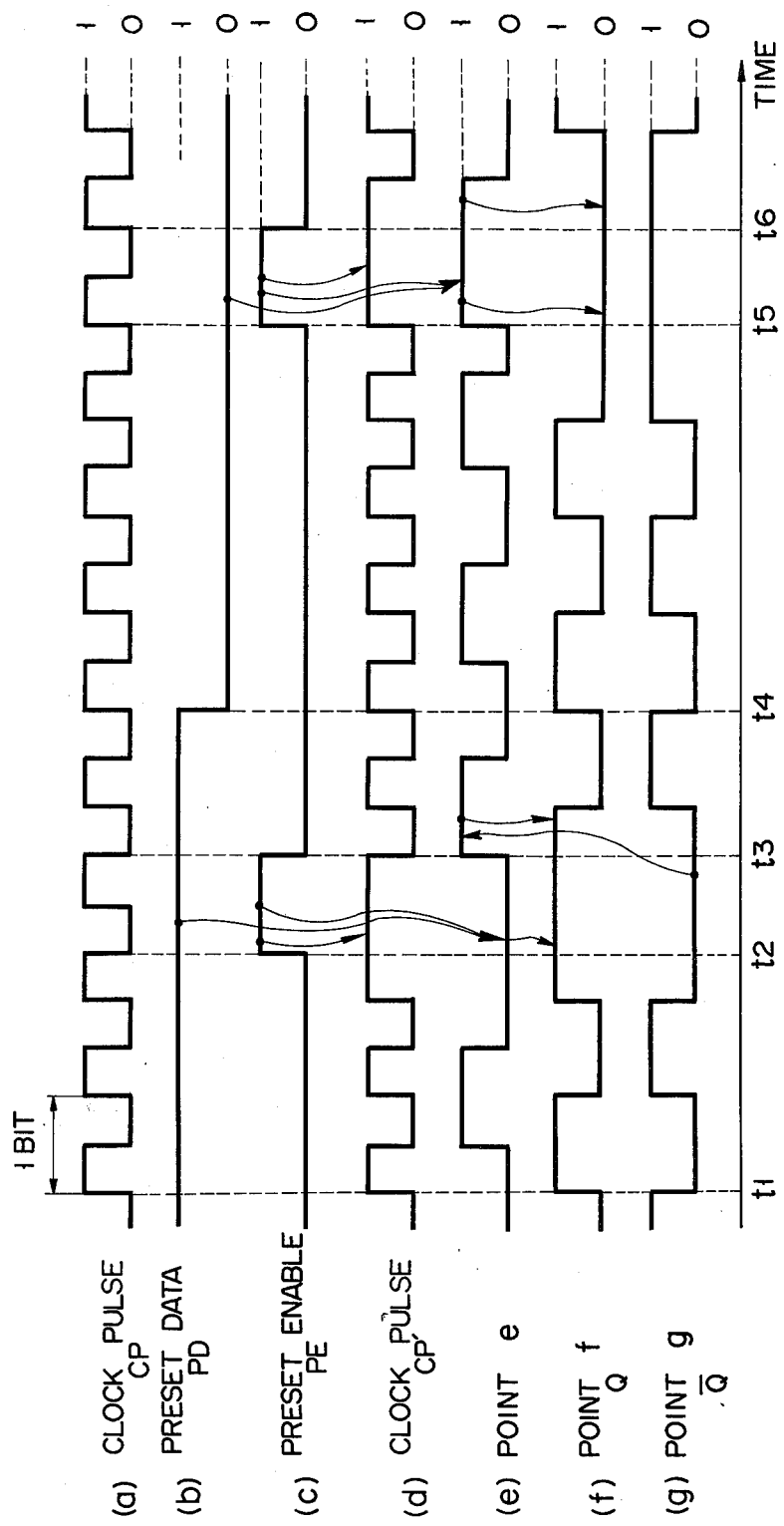
FIG. 4 is a time chart illustrating the operation of the flip-flop circuit of FIG. 2.

Referring to FIG. 1 showing the fundamental arrangement of a presettable dynamic delay flip-flop circuit according to one embodiment of this invention, referential numeral 11 denotes a gate circuit, which stops transfer of a clock pulse CP during a data-presetting period, and permits transfer of a clock pulse CP on other occasion than during the datapresetting period. When supplied with a preset-enable signal PE admitting of execution of a program and a clock pulse CP, the gate circuit 11 sends forth first and second gate signals G1, G2 whose phases are inverted from each other.

A first ½ bit delay circuit 12 remains intact during the data-presetting period, and carries out ½ bit delay in synchronism with the first gate output G1 from the gate circuit 11 on other occasion than during the data-presetting period. In this case, a period of a clock pulse CP is chosen to correspond to one bit.

A second ½ bit delay circuit 13 is connected to the output terminal of the first ½ bit delay circuit 12, and supplies a delayed output signal to said first ½ bit delay circuit 12 through an inverter 14 and a signal circulation line 15. The second ½ bit delay circuit 13 is rendered conducting during the data-presetting period, and carries out ½ bit delay in synchronism with the second output gate signal G2 from the gate circuit 11 on other occasions than during the datapresetting period. A switching circuit 16 is rendered conducting only during the data-presetting period to supply a preset data PD to the second ½ bit delay circuit 13. Namely, the switching circuit 16 serves to permit the preset data PD to be transmitted to the second ½ bit delay circuit 13 while a preset-enable signal PE is received.

FIG. 2 presents the arrangement of a flip-flop circuit according to one embodiment of this invention shown in FIG. 1. Referring to FIG. 2, the gate circuit 11 is supplied with a preset-enable signal PE and clock pulse CP, and is formed of a NOR gate 111 for sending forth a first gate signal G1 ($\overline{CP}'$) and an inverter 112 for inverting the logic level of an output from the NOR gate 111 and issuing the second gate signal G2 (CP'). As seen from FIG. 2, the first gate signal G1 ($\overline{CP'}$) and second gate signal G2 (CP') have phases inverted from each other. The preset-enable signal PE is divided into its original form PE and a form $\overline{PE}$ obtained by inverting said original form PE by an inverter 17. The first ½ bit delay circuit 12 is a clocked inverter operated when the first gate signal G1 (CP') has a logic level of "1". The second ½ bit delay circuit 13 is a clocked inverter operated when the second gate G2 ($\overline{CP'}$) has a logic level of "1". The switching circuit 16 is a clocked inverter operated when the preset-enable signal PE has a logic level of "1".

There will now be described, for example, the clocked inverter 12 by reference to FIG. 3 showing a detailed circuit arrangement common to the above-mentioned three clocked inverters. The clocked inverter 12 comprises a complementary type inverter circuit 121 formed of a pair of P- and N-channel FET's; a P-channel FET 122 provided between the one source of said complementary type inverter circuit 121 and power source $V_{DD}$ and rendered conducting when the second gate signal G2 (CP') has a logic level of "0"; and an N-channel FET 123 provided between the other source of said complementary type inverter circuit 121 and the ground and rendered conducting when the first gate signal G1 ($\overline{CP'}$) has a logic level of "1". The P- and N- channel FET's 122, 123 are transfer gates which are rendered conducting when the respective gates of said FET's 122, 123 are supplied with inputs whose phases are inverted from each other. In the clocked inverter, when both transfer gates are rendered conducting, then an input signal supplied to said complementary type inverter circuit 121 is drawn out in the inverted form. As compared with the initial input signal, therefore, this inverted output signal has a phase difference of 90° and is delayed by ½ bit. The other clocked inverters 13, 15 have the same circuit arrangement as the clocked inverter 12 and are operated in the same manner.

There will now be described by reference to the time chart of FIG. 4 the operation of the delay flip-flop circuit of this invention shown in FIG. 2. Now let it be assumed that a clock pulse CP is supplied, as shown in FIG. 4(a), to the delay flip-flop circuit, and that a preset data PD continues to be supplied to said delay flip-flop circuit until time t4 arrives, as shown in FIG. 4(b), in order to change the contents of the delay flip-flop circuit. A period extending from time t1 to time t2 lies outside of the period in which a program is executed. Since a preset-enable signal PE has a logic level of "0" as shown in FIG. 4(c), a clock pulse CP and a second gate signal G2 (CP') sent forth from the gate circuit 11 take the same waveform during a period from time t1 to time t2 as shown in FIGS. 4(a) and 4(d). At this time, a time lag of ½ bit takes place between a signal of FIG. 4(e) appearing at a point e and a signal of FIG. 4(f) appearing at point f through the second delay circuit 13. Further, the signal of FIG. 4(f) appearing at point f and the signal of FIG. 4(g) appearing at point g have phases inverted from each other.

During a period from time t2 to time t3, a preset-enable signal PE of FIG. 4(c) has its logic level inverted from "0" to "1". Therefore, while said preset-enable signal PE retains a logic level of "1", the clock pulse CP' (corresponding to the second gate signal G2) has a logic level of "1" as shown in FIG. 4(d). Since, at this time, the clock pulse $\overline{CP'}$ (corresponding to the first gate signal G1) has a logic level of "0", the first clocked inverter 12 remains intact. Further, since the preset-enable signal PE has a logic level of "1", the clocked inverter 16 is rendered conducting, and there appears at point e a signal having a logic level of "0" which is obtained by inverting a preset data PD having a logic level of "1" as shown in FIG. 4(e). Since the second gate signal G2 (CP') has a logic level of "1" as shown in FIG. 4(d), the second clocked inverter 13 is rendered conducting again to invert the logic level of the preset data PD which is supplied to said second clocked inverter 13 and whose logic level has already been inverted, thereby producing a signal having a logic level of "1" as shown in FIG. 4(f).

During a period from time t3 to time t4, the presetenable signal PE has its logic level inverted from "1" to "0" as shown in FIG. 4(c). Consequently, the clock pulse CP and the second gate signal (clock pulse CP') have the same phase, causing the first gate signal (clock pulse $\overline{CP'}$) to have a logic level of "1". Therefore, the first clocked inverter 12 is rendered conducting, and a signal of FIG. 4(g) appearing at point g is conducted to said first clocked inverter 12. As the result, a ½ bit delayed signal having a logic level of "1" appears at point e. While the second gate signal G2 (CP') retains a logic level of "0", the second clocked inverter 13 is rendered nonconducting, and a signal level of point f (Q terminal) holds a logic level of "1" as shown in FIG. 4(f). A signal level of point g ($\overline{Q}$ terminal) holds its logic level inverted to "0" by an inverter 14. While the succeeding second gate signal G2 (CP') retains a logic level of "1", the first clocked inverter 12 is rendered nonconducting and the second clocked inverter 13 is rendered operative. As the result, a signal of FIG. 4(e) at point e has a logic level of "1", and a signal of FIG. 4(f) at point f has a logic level of "0".

During a period from time t4 to time t5, the preset data PD has a logic level of "0", and the preset-enable signal PE also has a logic level of "0", causing the second gate signal G2 (CP') to have the same waveform as the clock pulse CP of FIG. 4(a) as shown in FIG. 4(d). Therefore, the subject delay flip-flop circuit acts as an ordinary dynamic binary counter.

During a period from time t5 to time t6, the preset data PD has a logic level of "0", and the preset-enable signal PE has a logic level of "1". Consequently, a second output gate signal G2 (CP') from the gate circuit 11 has a logic level of "1", as shown in FIG. 4(d), causing the first clocked inverter 12 to be rendered nonconducting, and both second clocked inverter 13 and clocked inverter 16 to be rendered conducting. At point e, therefore, these appears a signal of FIG. 4(e) having a logic level of "1" which is obtained by inverting the logic level of the preset data PD by the clocked inverter 16. At point f(Q) there appears a signal having a logic level of "0" which is obtained by inverting the logic level "1" of a signal appearing at point e by the second clocked inverter 13. Further, a signal of FIG. 4(g) at point g($\overline{Q}$) has its logic level inverted to "1" by the inverter 14.

During a period following time t6, the preset-enable signal PE has a logic level of "0" and in consequence the second gate signal G2(CP') takes the same waveform as a clock pulse CP. Where, therefore, said second gate signal G2 (CP') has a logic level of "1", then the first clocked inverter 12 is rendered nonconducting and the preset-enable signal PE has a logic level of "0", causing the clocked inverter 16 to be rendered inoperative and a signal of FIG. 4(e) at point e to retain a logic level of "1". Since at this time, the second clocked inverter 13 is rendered conducting, a signal of FIG. 4(f) at point f(Q) has its logic level inverted to "0". Later, the subject delay flip-flop circuit acts as an ordinary binary counter.

With the presettable dynamic delay flip-flop circuit of this invention, the second gate signal G2 (CP') has a logic level of "1" when the preset-enable signal PE has a logic level of "1". At this time, the first clocked inverter 12 is rendered nonconducting, the second clocked inverter 13 becomes operative, and the clocked inverter 16 is put into operation. The logic levels of signals of FIGS. 4(e), 4(f) and 4(g) at points e, f, g are defined by the logic level of the preset data PD. Namely, where the preset data PD has a logic level of "1", then signals of FIGS. 4(e) and 4(g) at points e, g have a logic level of "0" alike, and a signal of FIG. 4(f) at point f has a logic level of "1". Where the preset data PD has a logic level of "0", the above-mentioned logic levels are inverted. When the preset data has a logic level of "1", the presetting operation is brought to an end.

When the preset data PD has a logic level of "0", namely, when the subject delay flip-flop circuit acts an ordinary dynamic type binary counter, then the second gate signal (CP') takes the same waveform as the clock pulse CP and the clocked inverter 16 is rendered nonconducting. Therefore, the counter circuit of FIG. 2 acts as an ordinary dynamic binary counter circuit.

With the delay flip-flop circuit of this invention, when the preset-enable signal PE has a logic level of "1", all signals appearing at the output terminals e, f, g are made to have different prescribed values by the preset data PD. Since an output signal which is issued from the subject delay flip-flop circuit immediately before the preset data PD has a logic level of "1" can not retain a logic level independently of the logic level of said preset data PD, the subject delay flip-flop circuit is saved from an erroneous operation. Further advantage of this invention is that while the prior art static type binary counter comprises as many as, for example, 38 elements, the dynamic type binary counter of the invention uses as prominently decreased a number of elements as, for example, 22.

The delay flip-flop circuit of this invention shown in FIG. 2 may be formed of a circuit arrangement shown in FIG. 5. With the embodiment of FIG. 5, the ½ bit delay circuit and switching circuit respectively comprise a block circuit 51 (enclosed in broken lines) which replaces the clocked inverters 12, 13, 16 used with the embodiment of FIG. 2. This block circuit 51 is formed of an inverter 511 for inverting the logic level of an input signal supplied; and a transfer gate 512 for transferring an output signal from said inverter 511. This transfer gate 512 is formed of a pair of FET's of opposite polarities whose drains and sources are respectively connected together and which are rendered conducting when input signals of inverted phases are supplied to the respective gates.

The delay flip-flop circuit of FIG. 2 may further be modified into a circuit arrangement according to still another embodiment of this invention shown in FIG. 6. With the circuit arrangement of FIG. 6, the ½ bit delay circuit and switching circuit respectively comprise a block circuit 61 (enclosed in broken lines) which is substituted for the clocked inverters 12, 13, 16 used with the embodiment of FIG. 2. This block circuit 61 comprises an inverter formed of a first depletion type FET 611 whose gate and source are short-circuited, and a second enhancement type FET 612 which has the same conductivity type as the first FET 611 and is connected thereto in series, and adapted to invert the logic level of an input signal supplied to the second FET 612; and a third FET 613 for transferring an output signal from said inverter, said third FET 613 having the same conductivity type as the first and second FET's 611, 612 and being rendered conducting when the gate of said FET 613 is supplied with a prescribed signal.

The delay flip-flop circuits of FIGS. 5 and 6 are operated in the same manner with the same effect as that of FIG. 2.

There will now be described by reference to FIG. 7, for example, a 4-bit programmable counter comprising the presettable dynamic delay flip-flop circuit of FIG. 1. This counter is the so-called ripple carrier type in which four flip-flop circuits 71, 72, 73, 74 are connected in series; and an output from the preceding flip-flop circuit is used as a clock pulse for the succeeding flip-flop circuit. The $\overline{Q}_0$ output from the flip-flop circuit 71 and $Q_3$ output from the flip-flop circuit 74 are all conducted to a NAND circuit 75. An output signal X from the NAND circuit 75 is delivered to a 1-bit delay circuit 76. This 1-bit delay circuit 76 comprises, as shown in FIG. 8, a clocked inverter 761 rendered conducting when supplied with a clock pulse CP having a logic level of "1" and a clocked inverter 762 rendered conducting when supplied with a clock pulse $\overline{CP}$ having a logic level of "1". After passing through an inverter, an output signal from the 1-bit delay circuit 76 acts as a preset-enable signal PE. This preset-enable signal PE is supplied to the preset-enable terminals PE of the flip-flop circuits 71 to 74, for convenience, the same character PE denote both preset-enable signal and input terminal thereof. The preset data PD of FIG. 2 is used as a program data in the embodiment of FIG. 7. Now let it be assumed that program inputs have the following logical levels:

Program data $PD_0$ . . . "1"
Program data $PD_1$ . . . "1"
Program data $PD_2$ . . . "0"
Program data $PD_3$ . . . "1" and that the programmable counter of FIG. 7 is made to undertake a frequency division of 1/11. There will now be described the operation of the programmable counter of FIG. 7 by reference to a time chart of FIG. 9 illustrating said operation.

Now let it be assumed that clock pulses are supplied, as shown in FIG. 9(a) to the programmable counter. During the period of a clock pulse 2, an output signal X from the NAND circuit 75 has a logic level of "0" as shown in FIG. 9(f). The output signal X is delayed 1 bit by the 1-bit delay circuit 76. During the period of the succeeding clock pulse 1, the "0" output from the delay circuit 76 is inverted by the inverter 77 to act as a preset-enable signal PE having a logic level of "1" as shown in FIG. 9(g). As the result, the flip-flop circuit 72 supplied with a program data $PD_1$ having a logic level "1", and the flip-flop circuit 74 supplied with a program data $PD_3$ having a logic level of "1" are all set at a logic level of "1". While, therefore, the preset-enable signal PE retains a logic level of "1", the $Q_0$ outputs of FIG. 9(b), $Q_1$ output of FIG. 9(c) and $Q_3$ output of FIG. 9(e) all have a logic level of "1". When the preset-enable signal PE takes a logic level of "0", namely when the 11th clock pulse arrives, the $Q_0$ output from the flip-flop circuit 71 continues to have a logic level of "1", enabling the subject programmable counter to be operated in the normal condition.

The programmable counter of this invention shown in FIG. 7 can be operated at a frequency range of 50 to 60 MHz, namely, at a 10-times higher frequency than the prior art programmable counter which is generally operated at a frequency range of 5 to 6 MHz. Moreover, the subject programmable counter which comprises a much smaller number of presettable dynamic delay flip-flop circuit formed of IGFET's than has been required in the past easily admits of LSI.

The presettable dynamic delay flip-flop circuit of this invention is applicable not only to a programmable counter but also to any other circuit. Further, this flip-flop circuit can provide any other desired type of programmable counter by increasing a number of bits than the 4-bit programmable counter.

What we claim is:

1. A presettable dynamic delay flip-flop circuit which comprises gate means for stopping transfer of a clock pulse at least during a data-presetting period and permitting transfer of a clock pulse on other occasions than during the data-presetting period; first delay means remaining intact during the data-presetting period and carrying out ½ bit delay in synchronism with a first output gate signal from the gate means on other occasions than during the data-presetting period; second delay means connected to the output terminal of the first delay means, and served to feedback a delayed out signal from the first delay means, be rendered conducting during the data-presetting period and carry out ½ bit delay in synchronism with a second output gate signal from the gate means on other occasions than during the data-presetting period; and switching means designed to be rendered conducting only during the data-presetting period and supply preset data to the second delay means.

2. The presettable dynamic delay flip-flop circuit according to claim 1, wherein the gate means comprises a NOR gate for sending forth a first gate signal when supplied with a preset-enable signal and a clock pulse; and an inverter for inverting the logic level of an output signal from the NOR gate and issuing a second gate signal.

3. The presettable dynamic delay flip-flop circuit according to claim 1, wherein the first delay means, second delay means and switching means respectively comprise a clocked inverter including a complementary type inverter circuit formed of a pair of field effect transistors, and transfer gate field effect transistors provided on the source sides of said paired field effect transistors and rendered conducting when supplied with inputs of opposite polarities; and when the transfer gate is rendered conducting, an input signal supplied to the inverter circuit is drawn out with the logic level inverted.

4. The presettable dynamic delay flip-flop circuit according to claim 1, wherein the first delay means, second delay means and switching means respectively comprise an inverter for inverting the logic level of an input signal supplied thereto; and a transfer gate for transferring an output signal from the inverter, said transfer gate being formed of a pair of opposite polarities whose drains and sources are respectively connected together and are rendered conducting when the respective gates are supplied with input signals whose phases are inverted from each other.

5. The presettable dynamic delay flip-flop circuit according to claim 1, wherein the first delay means, second delay means and switching means respectively comprise an inverter formed of a first depletion type field effect transistor whose gate and source are short-circuited and a second enhancement type field effect transistor having the same conductivity type as the first depletion type field effect transistor and connected in series thereto, thereby inverting the logic level of an input signal supplied to the gate of the second enhancement type field effect transistor; and a third field effect transistor having the same conductivity type as the first and second field effect transistors and designed to be rendered conducting when the gate of said third field effect transistor is supplied with a prescribed signal, thereby transferring an output signal from said inverter.

6. The presettable dynamic delay flip-flop circuit according to claim 1, which further comprises an inverter for inverting the logic level of an output signal from the second delay means, and wherein an output from the second delay means is drawn out as a first output signal from the flip-flop circuit, and an output from the inverter is drawn out as a second output signal from said flip-flop circuit.

7. A programmable counter which comprises a prescribed number of presettable dynamic delay flip-flop circuits collectively arranged in the ripple carrier type, each of said flip-flop circuits including gate means for stopping transfer of a clock pulse at least during a period in which a program is to be executed and permitting transfer of a clock pulse on other occasions than during the programexecuting period, first delay means served to remain intact during the program-executing period and carry out ½ bit delay in synchronism with a first output gate signal from the gate means on other occasions than during the programexecuting period, second delay means connected to the output terminal of the first delay means and served to feedback a delayed output signal from the first delay means, be rendered conducting during the program-executing period and carry out ½ bit delay in synchronism with a second output gate signal from the gate means on other occasions than during the program-executing period, and switching means rendered conducting only during the program-executing period to supply program data to the second delay means; a NAND gate for NANDing a prescribed output from each of the plural flip-flop circuits; third delay means for carrying out a prescribed delaying operation in synchronism with a clock pulse when supplied with an output from the NAND gate, said third delay means including a first clocked inverter operated by a clock pulse whose logic level has been inverted and a second clocked inverter connected in series to the first clocked inverter to be operated by a clock pulse whose logic level has been inverted; and inverter means for inverting the logic level of an output signal from the third delay means to send forth a program-enable signal.

* * * * *